(12) United States Patent
Benedikt et al.

(10) Patent No.: US 9,897,637 B2
(45) Date of Patent: Feb. 20, 2018

(54) HIGH FREQUENCY PHASE REFERENCE STANDARD SIGNAL

(71) Applicants: Johannes Benedikt, Cardiff (GB); Tudor Vyvyan Williams, Rhondda Cynon Taff (GB)

(72) Inventors: Johannes Benedikt, Cardiff (GB); Tudor Vyvyan Williams, Rhondda Cynon Taff (GB)

( * ) Notice: Subject to any disclaimer, the term of this patent is extended or adjusted under 35 U.S.C. 154(b) by 190 days.

(21) Appl. No.: 14/434,189

(22) PCT Filed: Oct. 8, 2013

(86) PCT No.: PCT/GB2013/052617
§ 371 (c)(1),
(2) Date: Apr. 8, 2015

(87) PCT Pub. No.: WO2014/057255
PCT Pub. Date: Apr. 17, 2014

(65) Prior Publication Data
US 2015/0377941 A1 Dec. 31, 2015

(30) Foreign Application Priority Data
Oct. 8, 2012 (GB) .................................. 1218008.9

(51) Int. Cl.
*G01N 27/416* (2006.01)
*H04L 27/00* (2006.01)
*G01R 27/28* (2006.01)
*G01R 35/00* (2006.01)
*G01R 27/32* (2006.01)
*G01R 31/28* (2006.01)

(52) U.S. Cl.
CPC ............. *G01R 27/28* (2013.01); *G01R 27/32* (2013.01); *G01R 31/2841* (2013.01); *G01R 35/007* (2013.01)

(58) Field of Classification Search
CPC ...... G01R 27/28; G01R 35/007; G01R 27/32; G01R 31/2841
USPC .................................. 324/438, 601; 375/259
See application file for complete search history.

(56) References Cited

U.S. PATENT DOCUMENTS

| | | | | |
|---|---|---|---|---|
| 4,396,801 A | * | 8/1983 | Edson | H04J 3/042 370/345 |
| 2012/0082251 A1 | * | 4/2012 | Vanden Bossche | G01R 13/0272 375/259 |
| 2012/0243595 A1 | * | 9/2012 | Anderson | H04B 17/0085 375/228 |

* cited by examiner

*Primary Examiner* — Farhana Hoque

(57) ABSTRACT

A pre-characterised high frequency signal (14) is provided by means of a non-linear circuit, for example an amplifier circuit (10), fed with a first signal (12) with a component at a first, fundamental, frequency (FO). The amplifier circuit generates an output signal comprising harmonic components ($14_{h1}$, $14_{h2}$, $14_{h3}$) having stable and predetermined phase relation relative to each other. Information concerning the phase relation of the harmonic frequency components is provided, for example by means of a data file (16). At least two of the harmonic components are at the tenth or lower harmonic frequencies. The signal strength of such low-order harmonic components may be relative high, thus enabling the provision of a pre-characterised high frequency multi-tone signal from the amplifier circuit with high signal to noise ratio.

8 Claims, 5 Drawing Sheets

HIGH FREQUENCY PHASE REFERENCE STANDARD SIGNAL

BACKGROUND OF THE INVENTION

The present invention concerns the provision of a pre-characterised high frequency signal, for example for use as a phase reference standard. More particularly, but not exclusively, this invention concerns a method of providing a pre-characterised high frequency signal and a phase reference standard generating apparatus. The invention also concerns a calibration verification method, a method of measuring the response of an electronic device to a high frequency input signal and a method of producing a data file for a phase reference standard.

The provision of a pre-characterised high frequency signal for use as a phase reference standard facilitates, in the context of a high frequency measurement system, the transfer of absolute phase information to a time domain measurement system. This in turn assists with the analysing, and characterising, of the large signal behaviour of a high frequency device, commonly referred to in the art as a device under test (DUT). Such analysis and characterisation is for example useful when seeking to improve or optimize the performance of devices or circuits for use in high power, high frequency amplifiers, such as an amplifier for use in a mobile telephone network. Analysis is typically carried out with the assistances of a high frequency measurement apparatus, such as a vector network analyser (VNA). A VNA is typically capable of measuring the small signal (linear) performance of a DUT. However, to enable such a measurement apparatus to make non-linear (large signal) measurements, additional calibration steps are required, to ascertain absolute magnitude (power) and phase measurements of signals at the DUT. A VNA, once so calibrated and set-up to make non-linear measurements, is typically termed a non-linear vector network analyser (NVNA). Ascertaining the absolute magnitude of signals from measurements made by the VNA can be achieved by calibrating the VNA with reference to measurements directly made with a power meter. Ascertaining the absolute phase of signals from measurements made by the VNA can be achieved with the use of a phase reference standard, which may be defined by a pre-characterised high frequency signal.

There are proposals in the prior art relating to the provision and use of phase reference standards, such as the paper entitled "Time-Domain Calibrated Measurements of Wideband Multisines Using a Large-Signal Network Analyzer" by Mohammed El Yaagoubi, Guillaume Neveux, Denis Barataud, Tibault Reveyrand, Jean-Michel Nebus, Frans Verbeyst, Francis Gizard, and Jérôme Puech (IEEE Transactions on Microwave Theory and Techniques Vol. 56, No. 5, May 2008, pp 1180 to 1192)—the "Yaagoubi Paper". The Yaagoubi Paper proposes a pulse/comb generator made using step recovery diodes (SRD), yielding a multitude of harmonics with a known phase relationship. The fundamental frequency is relatively low, 20 MHz. The Yaagoubi Paper discusses use of the $80^{th}$ to $83^{rd}$ harmonics, corresponding to RF frequencies of 1.6 GHz, 1.62 GHz, 1.64 GHz, and 1.66 GHz. The multitude of harmonics have a relatively low and ever decreasing magnitude (typically following a 20 dB drop-off per decade) that has the potential benefit of forming a relatively fine calibration grid that can be aligned with frequencies to be measured. However, this spreads the available energy from the standard over a large frequency range and a large number of harmonics. With increasing frequency, the harmonics have a lower and lower signal to noise ratio, until the amplitudes of components of the comb drop towards the noise floor of the measurement system. This limits the accuracy of the measurements particularly at higher frequencies. Coping with the next generation of VNA, which should operate at yet higher frequencies, will place greater emphasis on accuracy of a phase reference standards at high frequencies.

The present invention seeks to mitigate one or more of the above-mentioned problems. Alternatively or additionally, the present invention seeks to provide an improved method of providing a pre-characterised high frequency signal and/or an improved phase reference standard generating apparatus.

SUMMARY OF THE INVENTION

The present invention provides a method of providing a pre-characterised high frequency signal. The method comprises the steps of providing a non-linear circuit, for example an amplifier circuit, feeding a first signal having a first, fundamental, frequency into the non-linear circuit, and the non-linear circuit generating an output signal comprising components at a plurality of harmonic frequencies, the components of the plurality of harmonic frequencies having stable phase relation relative to each other. Information concerning the phase relation of said plurality of harmonic frequency components may be provided, such that the output signal can be considered as a pre-characterised high frequency multi-tone signal. At least two of said plurality of harmonic frequency components are at the tenth or lower harmonic frequencies. The pre-characterised high frequency multi-tone signal advantageously provides a phase reference standard, the characteristics of which being characterised by said information. In embodiments of the invention, the pre-characterised high frequency signal can then advantageously be used, within a high-frequency measurement system for measuring the behaviour of nonlinear high frequency devices, as a phase reference standard. A phase reference standard can be used to for example to correct for the phase of the measurements. Absolute phase and magnitude measurements may then be obtainable.

It is preferred that the output signal from the non-linear circuit does not contain any high frequency components which are not harmonics of the or each fundamental frequency. It may be that the majority, preferably at least 75%, and possibly at least 90%, of the power of the harmonic components of the pre-characterised high frequency signal generated by the non-linear circuit is carried by harmonic frequency components at the tenth or lower harmonic frequencies. Preferably the collective power as represented by the harmonic components is collectively more than the power of the signal, if any, outputted at the fundamental frequency. Having a non-linear circuit that reliably generates a small number of low order harmonic components with relatively large power, enable a more stable and accurate pre-characterised high frequency multi-tone signal (for example a phase reference standard) to be produced. It may be that at least 75% of the energy within the output signal is utilised in the signal components of the phase reference standard. At least 90% of such energy may be so used.

As mentioned above, the non-linear circuit may be in the form of an amplifier circuit. Such an amplifier circuit may provide bandwidth advantages. Such an amplifier circuit may be readily adapted for a particular purpose. An amplifier may produce stronger harmonic content under high drive due to the significant non-linearities present. An amplifier may be less sensitive to high drive power as compared to, say other non-linear devices such as non-linear transmission lines. Amplifier circuits capable of operating at the very high frequencies required are readily available. As an amplifier has gain, attenuators can be used at the input and output of the amplifier to improve the sensitivity to the impedance environment surrounding the phase reference, which is a known problem with other phase reference technologies.

Using a non-linear circuit in the form of an amplifier is therefore a preferred, yet optional, feature. Below features are described with reference to an amplifier circuit but it will readily be appreciated by the reader that such features will typically be suitable and useable with other non-linear circuits.

In accordance with the method of the invention, at least two of the harmonic components are at the tenth or lower harmonic frequencies. As mentioned above, the signal strength of such low-order harmonic components may be relatively high, thus enabling the provision of a pre-characterised high frequency multi-tone signal from the amplifier circuit with high signal to noise ratio. The number of harmonic components generated by the amplifier circuit may be limited but may nevertheless provide a sufficient number of harmonic components with sufficient energy focussed on the frequencies of interest, making noise less of an issue. This may lead to increased accuracy in the phase measurements. The use of an amplifier circuit, based on standard transistor technology, may lessen or remove the need for further development in pulse/comb generators whenever higher frequency VNAs become available, because such amplifiers and transistors are already available at frequencies greater than 100 GHz. Coping with such higher frequency VNA capability should therefore simply be a matter of scaling the amplifier circuit of the present invention as required.

There may be a stable phase relation of the components at the fundamental frequency and the harmonic frequency components of the output signal from the amplifier circuit. This relation may also advantageously be known in advance. It will be appreciated that the fundamental frequency component and the harmonic components of the output signal will typically be out of phase. There may be other harmonics generated by the amplifier circuit, in respect of which information concerning the phase relation is not provided. It may be the case that the output signal from the amplifier circuit does not contain any high frequency components which are not harmonics of the fundamental frequency. (It will be appreciated however that the pre-characterised high frequency multi-tone signal, finally used as a phase reference standard for example, may also comprise a set of further harmonic signals, for example generated by a further non-linear circuit or generated by the same non-linear circuit when fed with a multi-tone signal having two or more different fundamental frequencies). It may be the case that the output signal from the non-linear circuit does contain some high frequency components which are not harmonics of the fundamental frequency, but that such non-harmonic components are not used for the purpose of a phase-reference standard. Preferably the output signal does not contain any high order harmonics of the fundamental frequency, such as for example higher than the 20$^{th}$ harmonic, at a significant magnitude. The information provided concerning the phase relation of the harmonic frequencies may be limited to information concerning the phase relation of at most the first ten harmonics. The first signal may have an unknown phase. The first signal may comprise other signal components not at the fundamental frequency. Such other signal components may be high frequency components, for example, of a frequency comparable to the fundamental frequency. For example, the first signal may itself be in the form of a multi-tone signal having components at different frequencies. In such a case the high frequency component, of the first signal, having the lowest frequency may be considered as defining the first fundamental frequency. The next highest frequency component can be considered as defining a second, fundamental, frequency. In response to the component at the second fundamental frequency, the amplifier circuit preferably generates components in the output signal at a plurality of harmonic frequencies (with respect to the second fundamental frequency), such harmonic components also having a stable and known phase relation relative to each other. The first signal may however comprise only one high-frequency component, of any non-negligible magnitude, that being at the fundamental frequency.

The amplifier circuit may generate an output signal comprising components at the fundamental frequency and at least four harmonic frequencies. Preferably, the method uses at least the second and third harmonic components. Preferably, said information concerning the phase relation of said plurality of harmonic frequency components includes information relating the phase relation of both the first and second harmonic frequency components, and possibly also the third harmonic. Preferably, there is no harmonic component for which phase relation information is not included as part of said information having a frequency lower than a harmonic for which phase relation information does form part of said information. The amplifier circuit is preferably configured so that it can accept an input signal at any fundamental frequency within the range from 0.5 Ghz to 35 GHz. The amplifier circuit may of course be able to operate at other frequencies too. The fundamental frequency of the first signal may be greater than 100 MHz. A signal having a frequency higher than 100 MHz may be deemed as "high frequency" within the context of certain embodiments of the present invention.

The output signal may be fed to a vector network analyser (VNA). The VNA may be defined by a Large Signal Network Analyzer (LSNA). The VNA may be a non-linear vector network analyser (NVNA).

The VNA may be used to measure characteristics of signals at a device under test (DUT) at different frequencies (for example at the fundamental and harmonic frequencies). By use of (i) the information concerning the phase relation of the harmonic frequencies of the output signal (i.e. the pre-characterised high frequency multi-tone signal) produced by the method and (ii) that output signal, phase information of the signals at the DUT may be ascertained, for example enabling transformation of such measured signals from the frequency domain to the time domain.

The first signal fed to the amplifier circuit is preferably generated by a signal generator able to produce high frequency signals of, for example, at least 1 GHz. The signal generator is preferably able to produce high frequency signals of, for example, up to at least 50 GHz, and possibly up to at least 70 GHz. The fundamental frequency of the first signal is preferably over 1 GHz. The fundamental frequency may be between 500 MHz and 70 GHz. The first signal may be phase-locked to a signal generated by, or fed to, the VNA. The first signal may be generated by a signal generator of the VNA. The first signal may be used to trigger the VNA. A component of the output signal from the amplifier circuit may be used to trigger the VNA. The information (concerning the phase relation of said plurality of harmonic frequency components) may include information concerning the phase relation of said plurality of harmonic frequency components, as generated by a first signal, at any one of a multiplicity of difference fundamental frequencies.

The amplifier circuit may include an amplifier (for example a class A amplifier) which, if provided with the first signal as its input would generate harmonic components such that the average magnitude of the odd harmonic components would be a first factor higher than the average magnitude of the even harmonic components. The amplifier circuit may include an amplifier (for example a class B amplifier) which, if provided with the first signal as its input would generate harmonic components such that the average magnitude of the even harmonic components would be a second factor higher than the average magnitude of the odd harmonic components. The amplifier circuit may include first and second amplifiers. For example the first amplifier may generate strong odd harmonic component content and the second amplifier may generate strong even harmonic component content. The first and second amplifiers may be arranged to complement each other's performance. Whichever is the higher of the average magnitude of the odd harmonic signals output by the amplifier circuit and the average magnitude of the even harmonic signals output by the amplifier circuit is a third factor higher than whichever is the lower of the average magnitude of the odd harmonic signals output by the amplifier circuit and the average magnitude of the even harmonic signals output by the amplifier circuit, the third factor thus being lower than both the first factor and the second factor. Preferably the third factor is less than 2. Preferably the third factor is less than 1.5. The first factor may be greater than 2. The second factor may be greater than 2. The amplifier circuit may thus comprise two amplifiers. The two amplifiers may be arranged in parallel. The two amplifiers may be arranged in series. The amplifier circuit may include further amplifiers. Thus, the amplifier circuit may comprise more than two amplifiers.

The magnitude of at least two of the plurality of harmonic frequency components at the tenth or lower harmonic frequencies may be within a factor of 2 of each other. The magnitudes of at least two of the plurality of harmonic frequency components at the tenth or lower harmonic frequencies may differ by more than a factor of 1.5 of each other, and may differ from each other by more than a factor of 2 of each other. For most of the power to be distributed between the lower order harmonics, the power of higher order harmonics will need to drop off relatively rapidly. For there to be sufficient power in each of at least two different harmonic components the power must not drop off too rapidly from one harmonic to the next.

The method may include providing a further non-linear circuit, feeding a further signal having at a different fundamental frequency into the further non-linear circuit, such that the further non-linear circuit generates an output signal comprising components at a plurality of harmonic frequencies, the components of the plurality of harmonic frequencies having stable phase relation relative to each other, and combining, or otherwise using together, the output signal from the first-mentioned non-linear circuit and the output signal from the further non-linear circuit to form a pre-characterised high frequency multi-tone signal. Such a pre-characterised high frequency multi-tone signal will preferably have at least two harmonic frequency components, at the tenth or lower order harmonic of the first fundamental frequency and at least two harmonic frequency components, at the tenth or lower order harmonic of the different fundamental frequency. The output signal from the non-linear circuit will therefore only contain high frequency component which are harmonic of the first fundamental frequency or the different fundamental frequency.

Similarly, the method may include feeding a signal component into the first-mentioned non-linear circuit having a different fundamental frequency from the first, fundamental, frequency. The non-linear circuit may then generate an output signal comprising components at a plurality of harmonic frequencies, being harmonics of two or more fundamental frequencies. The resulting pre-characterised high frequency multi-tone signal may then have at least two harmonic frequency components, at the tenth or lower order harmonic of the first fundamental frequency and at least two harmonic frequency components, at the tenth or lower order harmonic of the different fundamental frequency.

It may be that the invention provides a method of providing a pre-characterised high frequency signal comprising the steps of providing a non-linear circuit, feeding a first signal having a first, fundamental, frequency into the non-linear circuit, optionally feeding further signals having one or more different fundamental, frequencies into the non-linear circuit. In such a case, the non-linear circuit generates an output signal comprising components at a plurality of harmonic frequencies corresponding to the first, fundamental, frequency and, optionally, components at a plurality of harmonic frequencies corresponding to the one or more different fundamental, frequencies. The components of the plurality of harmonic frequencies for each such fundamental frequency will have stable phase relation relative to each other, but possibly not in relation to the harmonics corresponding to a different fundamental frequency. The output signal from the non-linear circuit preferably does not contain any high frequency components which are not harmonics of the or each fundamental frequency fed into the non-linear circuit.

The amplifier circuit may be configured to operate at certain conditions so that the harmonic components are reliably generated in accordance with the phase relations consistent with the information concerning the same. For example an operating temperature may be specified. A particular biasing arrangement may be required. The power of the drive signal may need to be controlled or otherwise accounted for. Input and/or output impedance may need to be controlled, for example by means of one or more attenuators. Having an amplifier circuit, providing gain, can therefore be advantageous in embodiments of the invention which use attenuators at the input and/or the output of the amplifier to improve the sensitivity to the surrounding impedance environment. The amplifier circuit may be maintained at a substantially constant temperature. The substantially constant temperature may be significantly above ambient temperature. For example the substantially constant temperature may be above 35 degrees Centigrade, and is preferably greater than 40 degrees Centigrade. A thermally controlled chamber may be provided for maintaining the amplifier circuit at a substantially constant and pre-set temperature.

As mentioned above, the present invention could be implemented by using means, other than an amplifier circuit, for generating the output signal comprising components at a plurality of harmonic frequencies. Thus, references herein to an "amplifier circuit" for such purposes may be replaced with a "non-linear circuit". The requirements for such a non-linear circuit are that when it may be driven with an input signal in such a way that it generates a plurality of harmonic frequencies having stable phase relation relative to each.

According to a second aspect of the invention there is provided a calibration verification method utilising the phase reference standard of the present invention. The method of verification may comprise the steps of testing the calibration of a measurement apparatus by means of using the measurement apparatus to measure at least one of (a) the absolute phase relation between different signal components (for example having a different frequency) and (b) time domain measurements of a signal component relative to a fixed time, wherein the signal component(s) so measured are provided by means of any aspect of the present invention described or claimed herein. For example such a verification method may be used to verify the absolute phase measurements of a NVNA or of a time domain measurement system.

According to a third aspect of the invention there is also provided a method of measuring the response of an electronic device to a high frequency input signal using phase reference standard of the present invention or using a measurement system that has been calibrated by means of the above verification method. Such a method of measuring the response of an electronic device may comprise the steps of:

providing an electronic device having a first port and a second port, and applying a high frequency signal to the device, providing a measurement system including a measurement apparatus having a plurality of inputs for measuring high frequency signals from the first and second ports, measuring, at a plurality of different frequencies, and with the use of the plurality of inputs of the measurement apparatus, signals from the first and second ports of the device, ascertaining at least one of (a) absolute phase information from the signals so measured and (b) a time domain representation relating to the signals so measured. This can be achieved by means of using a pre-characterised high frequency multi-tone signal and information concerning the phase relation of the harmonic frequency components of said pre-characterised high frequency multi-tone signal, both being provided by means of any aspect of the present invention described or claimed herein. The phase reference standard provided by the present invention for use in this measurement method preferably provides a stable, harmonically rich signal, which is pre-characterised with known harmonic phase relationships over the entire measurement bandwidth.

The high frequency signal applied to the device under test may be phase-locked with the first signal supplied to the amplifier circuit. The first signal supplied to the amplifier circuit may be otherwise phase-locked with the measurement apparatus. The measurement apparatus may have its own one or more internal signal generators and such one or more signal generators may be used to provide both the first signal to the amplifier circuit and the trigger signal for the measurement apparatus. The measurement apparatus may be triggered by the same signal as fed to or supplied by the amplifier circuit. Unlike alternative approaches which typically use two reference standards, one to trigger the measurement apparatus and one to correct for absolute phase, the present embodiments of the present invention may allow for simultaneous triggering and correction.

Preferably, the plurality of harmonic frequencies span the measurement bandwidth and said information concerning the phase relation of the harmonic frequencies includes the phase relation of each harmonic frequency within the measurement bandwidth. There may be no harmonic component of the output signal that is outside the measurement bandwidth.

The method of measuring the response of an electronic device to a high frequency input signal is advantageously repeated and performed in respect of a multiplicity of different conditions applied to the device. The method may for example be repeated and performed in respect of a multiplicity of different input signals applied to the device. The different input signals applied to the device may be at different frequencies and/or under different load conditions. The method may for example be performed to simulate different loads on the device. The method may be performed to simulate different impedances applied to the device. A load or impedance may be simulated by means of a load pull circuit attached to the device. The different input signals may be applied to the device at different fundamental frequencies. The fundamental frequency of the first signal (fed into the amplifier circuit in order to generate the pre-characterised high frequency signal) may be varied to match the different fundamental frequencies as appropriate. As such, said information concerning the phase relation of said plurality of harmonic frequency components, may be provided at each of a plurality of different frequencies.

The method of the invention is of particular application when the device (the DUT) is a non-linear device, especially where the device is to be used in an application where the operating range of the device is such that non-linear behaviour is significant. As such, the method is preferably performed to measure the non-linear behaviour of the electronic device (the DUT). The non-linear device (the DUT) may be non-linear in the sense that the relationship between the output voltage and the input voltage is not linear. The non-linear device (the DUT) may for example be a diode, a mixer, an oscillator or a frequency multiplier such as a doubler, or an amplifying device such as a transistor. The device may be a high power device. The device may be a high power amplifier. The device may be a high power transistor. The device may for example be a device suitable for use as a high power amplifying device in a mobile telecommunications base station. In such cases, the method advantageously includes a step of applying a high power signal to the device (the DUT). Such high powers may, depending on the device concerned, be greater than 1 W. In some case powers of 5 W may be used and in some cases the power may be greater than 10 W.

The measurement unit advantageously is able to measure and characterise a waveform substantially fully across the time domain. The measurement unit is preferably able to measure accurately waveforms having fundamental frequencies over a frequency range between 500 MHz and at least 70 GHz. Of course, the measurement unit may also be able to measure signals having frequencies outside this range. The measurement unit is preferably able to measure high voltage waveforms having fundamental frequencies above 500 MHz.

The method may include a step of applying a waveform to the device, the waveform having a plurality of single frequency harmonic components. The waveform may, for example, include a component having a fundamental frequency at a first frequency and a component at a harmonic frequency. More complicated waveforms, including components at other frequencies, may be applied. The method may include a step in which signals are simultaneously applied at more than one port of the device under test. The device under test may have more than two ports. In such a case, the method of measuring the response of the device may include making measurements at more than two ports of the device.

According to a fourth aspect of the invention there is also provided a phase reference standard generating apparatus for producing a pre-characterised high frequency signal. The apparatus may comprise a non-linear circuit, for example in the form of an amplifier circuit. The non-linear circuit (or amplifier circuit) is preferably so arranged that when fed with a first signal with a component at a first, fundamental, frequency the circuit generates an output signal comprising components at a plurality of harmonic frequencies, the harmonic components having stable phase relation relative to each other, thus defining a pre-characterised high frequency signal that can be used as a phase reference standard. The apparatus may also include a data file comprising information concerning the phase relation of said plurality of harmonic frequency components. The data file may be an electronic data file. The data file may be a computer readable data file. According to a fifth aspect of the invention there is also provided a method of producing a suitable data file. Such a method may comprise the steps of providing a phase reference standard generating apparatus of the invention (i.e. including a non-linear circuit or an amplifier circuit) and feeding the non-linear circuit/amplifier circuit with a first signal with a component at a first, fundamental, frequency, the non-linear circuit/amplifier circuit thus generating an output signal comprising components at a plurality of harmonic frequencies, the harmonic components having a stable phase relation relative to each other (and also, advantageously, having a stable phase relation relative to the fundamental frequency component of the output signal), ascertaining the phase relation of said plurality of harmonic frequency components, for example by means of previously calibrated measuring apparatus, and recording information concerning such phase relation in a data file.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of the present invention will now be described by way of example only with reference to the accompanying schematic drawings of which.

DETAILED DESCRIPTION

Figure 1:
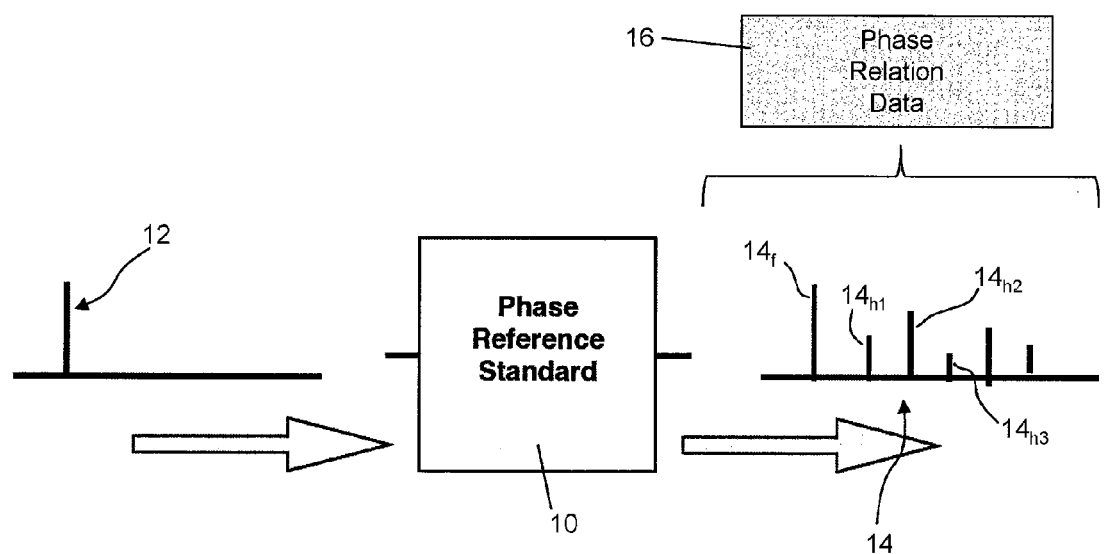
FIG. 1 shows a phase reference system according to a first embodiment of the invention.

FIG. 1 shows schematically a first embodiment of the present invention. A phase reference standard system is provided, which comprises an amplifier circuit 10. The phase reference standard system produces a reference standard, at a given frequency, which can then be used in any application that requires a pre-characterised multi-tone high frequency signal with known phase relation information. The reference standard has particular application in systems that operate at the GHz frequency range but may have application at lower frequencies, for example, down to 100 MHz level (which in most electronics application would still be termed as high frequency). The reference standard may for example enable the absolute phase information in respect of measurements made using a VNA to be determined The reference standard may be used in calibration procedures. The reference standard may be used to verify calibration procedures effected by other independent means.

The amplifier circuit 10 of the phase reference standard system of FIG. 1 receives a signal 12 at a single frequency with fixed pre-calibrated power. The amplifier circuit produces a multi-tone output signal 14 comprising components at the fundamental frequency ($14_f$) and a number of harmonics ($14_{h1}$, $14_{h2}$, $14_{h3}$, etc). The number of harmonics used by the phase reference standard system is limited to the first ten harmonics at most. The advantage of using only lower harmonics is that it allows the available energy to be concentrated on the frequencies of interest, over a relatively low bandwidth (but of course covering the measurement bandwidth for the end application of the phase reference standard), such that the harmonic components have a relative high signal to noise ratio resulting in an accurate, high amplitude, reference standard.

The harmonic components $14_{h1}$, $14_{h2}$, $14_{h3}$ have a given (stable) phase relationship relative to the fundamental frequency component $14_f$. The phase relation between the respective components is pre-characterised (for example by means of measuring the phase relation previously with a calibrated phase meter, such as an oscilloscope) and data 16 concerning the phase relationship is provided. The data 16 includes information on the phase relationship between the different harmonic components $14_{h1}$, $14_{h2}$, $14_{h3}$, at each of many different fundamental frequencies (the frequencies corresponding to the frequencies at which measurements will be made or at which the phase reference standard will otherwise be used). Such data 16 can then be used, in conjunction with the harmonically rich and pre-characterised output signal 14, as a reference standard, as described above.

Figure 2:
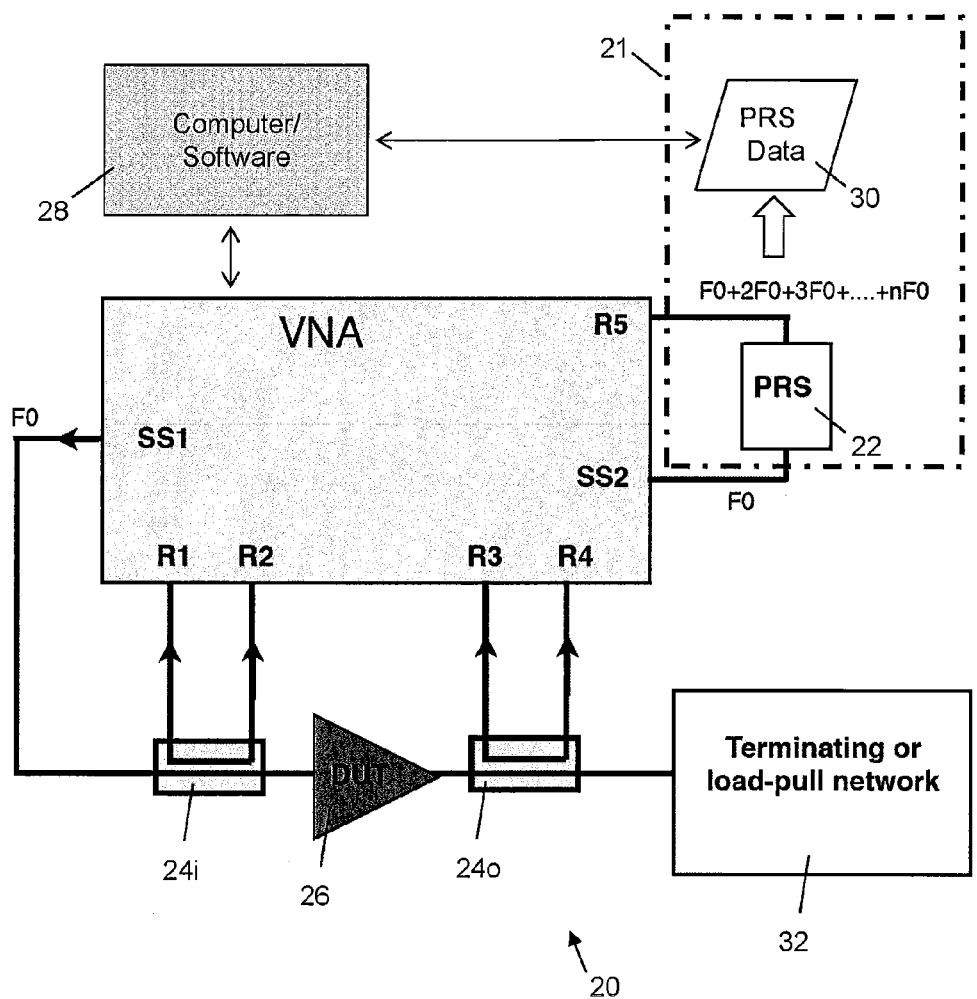
FIG. 2 shows a measurement system utilising a phase reference system according to a second embodiment of the invention.

A second embodiment of the invention is shown in FIG. 2, which illustrates schematically a measurement system 20 including a phase reference standard system 21. A Vector Network Analyser (VNA), such as a ZVA-67 available from Rohde and Schwarz, is connected to measure the response characteristics of a DUT (device under test) 26. A port of the DUT 26 is connected to a first signal source (SS1)—a simple mono-tone signal at a fundamental frequency F0. A first directional coupler 24i is used to sample a portion of the forward and reflected travelling waves at the input of the DUT 26. A second directional coupler 24o is used to sample a portion of the forward and reflected travelling waves at the output of the DUT 26. The forward and reflected travelling waves at both input and output of the DUT 26 (four travelling waves in total) are then measured by the receivers of the VNA (receivers R1-R4). The phase reference standard system 21 includes a reference signal generator 22, which is connected to a 5th measurement receiver R5 and is measured along with the four travelling waves during each measurement.

The reference signal generator 22 is fed with an input signal, by a second signal source SS2, at the same frequency as, and phase-locked to, the signal from the first signal source SS1. The reference signal generator 22 includes an amplifier arranged and biased such that it generates an output signal comprising components at the fundamental frequency and the first five harmonic frequencies 2 F0, 3 F0, 4 F0 and 5 FO. Components at higher harmonics are, for the purposes of this embodiment, of no interest and sufficiently negligible as to require no special treatment. The harmonic frequency components and the fundamental frequency component outputted by the reference signal generator 22 have stable phase relation relative to each other (and are not all in-phase). The phase relationship is pre-characterised and defined by phase reference data 30 stored electronically in the measurement system 20.

A mode of standard operation (known in the prior art and not in accordance with the present embodiment) of a VNA when making measurements in respect of a DUT at the fundamental and harmonic frequencies, includes stepping the local oscillator (LO) of the VNA to capture the signals at the fundamental frequency and harmonics. However, the phase of the LO is typically randomised when switching from one frequency to the next, which makes tracking the relative phase of the harmonics output by the DUT impossible. In contrast to this prior art mode of operation, the present embodiment enables the relative phase of the harmonics output by the DUT to be ascertained by reference to the corresponding harmonics of the reference signal generator 22. This is achieved in software 28 by means of algorithms, readily known to the skilled person, that use (a) the predetermined phase relationship information (data 30) concerning the phase reference signal and (b) measurements of both the phase reference signal and the four travelling waveforms at the DUT. This then allows not only magnitude but phase information to be extracted from the large signal waveforms at the DUT to be ascertained, in accordance with known techniques.

The embodiment of FIG. 2 includes a load pull circuit 32 at the output port of the DUT. A terminating circuit could alternatively be supplied.

When using the embodiment of FIG. 2, the fundamental stimulus frequency F0 remains fixed and the stimulus signal from a first signal source (SS1) excites the DUT 26. Receivers R1-R2 and R3-R4 are used to measure the forward and reflected travelling waves at the input and output of the DUT respectively, at a frequency determined by the frequency of a local oscillator ("LO"—not shown in FIG. 2) of the VNA. The output of the DUT 26 contains mixing terms at harmonics of F0, which are measured. To do this, the LO of the VNA is stepped so as to allow the VNA to effect measurements at each harmonic, whilst the first and second signal sources SS1 and SS2 are maintained at the fundamental frequency F0. When performing the stepping of the LO, the output of the reference signal generator 22, as measured by R5, is used to simultaneously trigger the VNA measurement and to allow for correction of the absolute phase of the measured travelling waves, at the harmonic frequency of interest. Thus, unlike alternative approaches of the prior art which typically use two reference standards one to trigger the VNA and one to correct the absolute phase, the approach of this present embodiment, made possible through the referencing of an additional measurement port during calibration, allows the triggering and correction to be applied simultaneously. The travelling waves can then be mathematically transformed to display the measured voltage and current waveforms of the DUT at a pre-defined reference plane.

Figure 3:
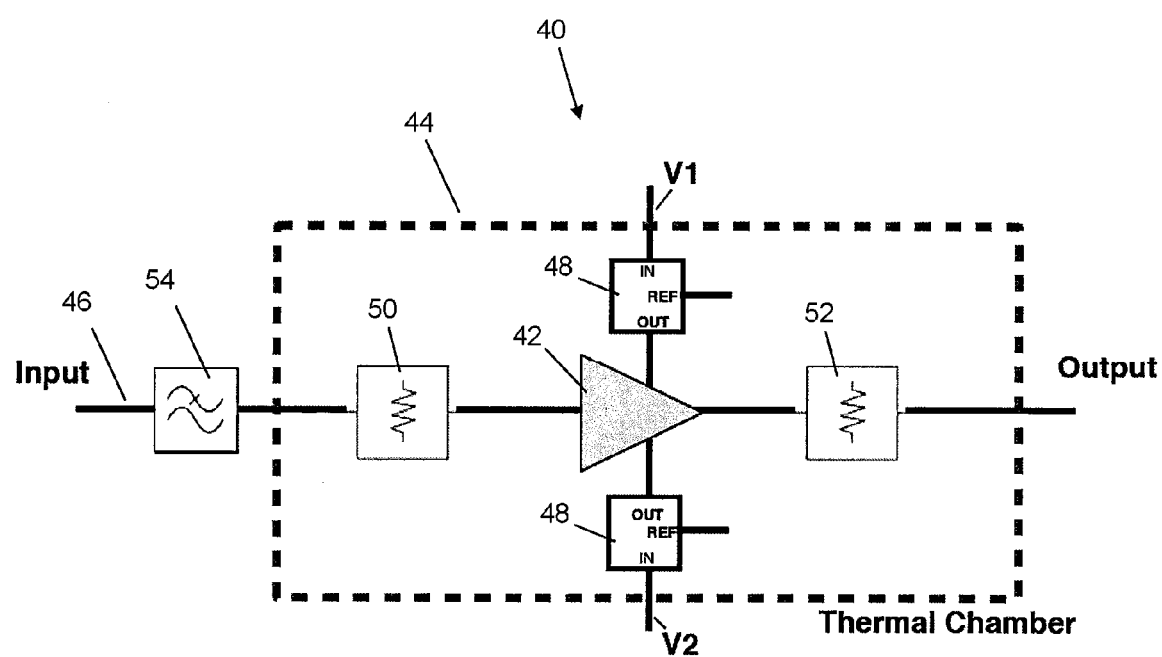
FIG. 3 shows a thermally controlled phase reference system according to a third embodiment of the invention.

It is recognised that both temperature and load conditions can affect the phase relation between harmonic components of the phase reference standard signal. As such, load and temperature conditions should either be controlled or compensated for. In a third embodiment, shown in FIG. 3, such environmental factors are compensated for and/or controlled. The phase reference standard signal generating module 40 of the third embodiment takes account of input drive level, temperature, bias, input/output impedance, and input signal purity. The module 40 is based on an amplifier circuit 42 housed in a thermal chamber, represented by the box 44 shown in FIG. 3. Experimental analysis has shown that the phase relationship at the output of an amplifier or transistor is sensitive to temperature. The thermal chamber 44 (in the form of a thermostatically controlled oven that encloses the amplified circuit 42) provides a thermally controlled environment such that the temperature of operation is set at a predetermined level. In this embodiment the operational temperature is chosen to be 45 degrees Centigrade.

It is important that the drive level of the input signal 46 be maintained at a pre-set power level. However, as the phase reference circuit 40 only needs, in use, to operate at a single input power (the same during normal use as used when the initially characterising the phase relation information of the harmonics generated by the circuit) such a requirement can readily be satisfied. However, a further calibration is preferably performed during setup of the module 40 for normal use, by checking with a power meter that the drive power levels are correct (i.e. at the same level as used when pre-characterising the device).

The biasing of the amplifier circuit 42 is controlled to reduce variation in the bias conditions of the amplifier circuit 42. Such variations might otherwise cause variation in the output phase relationships. The bias is controlled and regulated using bias regulation circuitry 48 in the supply lines (V1, V2).

Even small variations in the input impedance and/or output impedance environment around the amplifier circuit 42 can cause variations in the phase relationships. To mitigate this issue attenuators 50, 52 are provided at the input and output of the amplifier circuit 42 to reduce the sensitivity to impedance variations. Whilst the use of attenuators 50, 52 reduces the gain of the amplifier circuit 42, that is not a disadvantage in the present application, because signal amplification is not the function of primary importance; it is those non-linear characteristics of the amplifier circuit 42 that produce well-defined harmonic signals that are being exploited in the present embodiment.

The purity of the input signal 46 is also an important factor to consider. Analysis shows that injecting a signal with significant harmonic content into the amplifier circuit 42 would affect the output phase relationships. A spectrally clean signal source is therefore preferred. This can be achieved simply by using a signal generator of an appropriate specification and/or filtering the input to the amplifier circuit 42 with an appropriately selected low pass filter 54. (The input signal may in certain set-ups intentionally be in the form of a multi-tone signal.)

Figure 4:
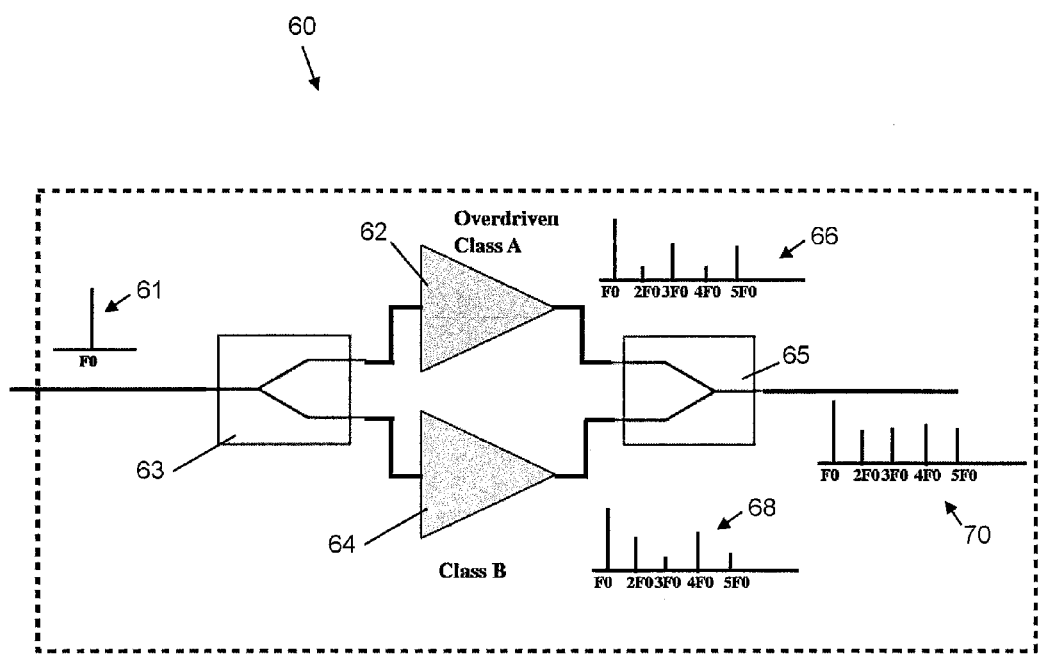
FIG. 4 shows a phase reference system, utilising two amplifiers arranged in parallel according to a fourth embodiment of the invention.

FIG. 4 shows a phase reference standard system 60 according to a fourth embodiment. The phase reference standard system 60 comprises first and second amplifier circuits 62, 64 arranged in parallel. A single input signal 61 at the fundamental frequency is split by means of a signal splitter 63 into two substantially identical sub-signals of the same magnitude (but possibly different phase), one sub-signal being fed to the first amplifier circuit 62 and the other sub-signal being fed to the second amplifier circuit 64. The first amplifier circuit 62 is a class A amplifier, whereas the second amplifier circuit 64 is a class B amplifier. The first class A amplifier circuit 62 when suitably overdriven produces strong odd harmonic content due to the symmetric clipping against the DC boundaries of the device, but relatively weak even harmonics (see the schematic frequency spectrum 66 shown in FIG. 4). The second class B amplifier circuit 64 when suitably biased produces strong even harmonic content due to the asymmetric clipping caused by the selected bias point, but relatively weak odd harmonics (see the schematic frequency spectrum 68 shown in FIG. 4). By combining (with a signal combining circuit 65), the outputs of the two amplifiers 62, 64, the resulting output signal comprises odd and even harmonics of comparable magnitude with neither odd nor even harmonic content significantly dominating (see the schematic frequency spectrum 70 shown in FIG. 4). Such an output signal thus has an output spectrum 70 that had good strong harmonic content across the band.

Figure 5:
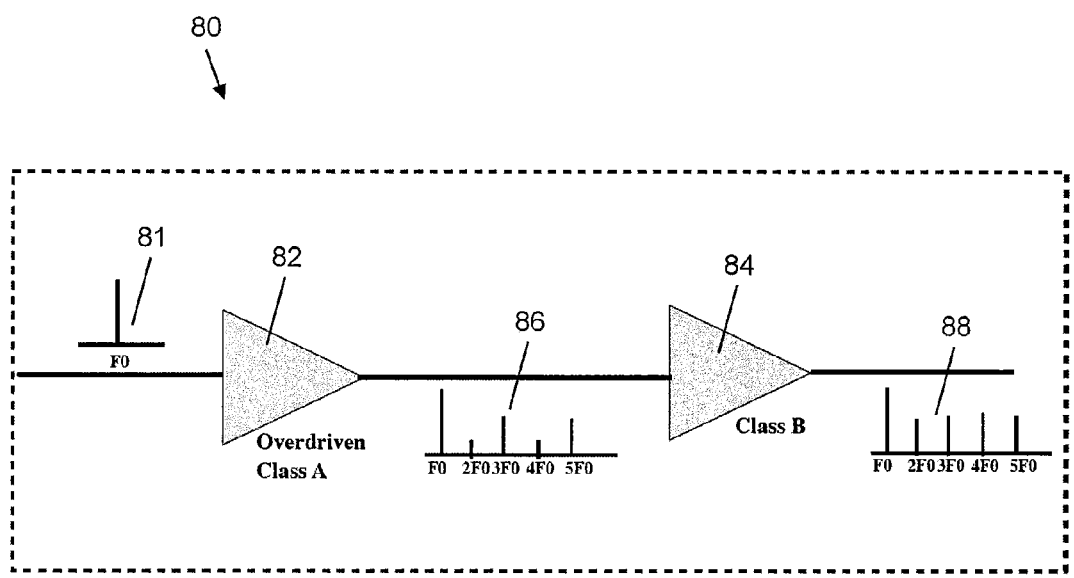
FIG. 5 shows a phase reference system, utilising two amplifiers arranged in series according to a fifth embodiment of the invention.

FIG. 5 shows a phase reference standard system 80 according to a fifth embodiment that, in a similar manner to the fourth embodiment, comprises first (class A) and second (class B) amplifier circuits 82, 84. In this case, however, the first and second amplifier circuits 82, 84 are arranged in series. A single input signal 81 at the fundamental frequency is fed to the first (class A) amplifier circuit 82. The output from the first (class A) amplifier circuit 82, including strong odd harmonic content (see spectrum 86) is then fed to the second (class B) amplifier circuit 84. The second (class B) amplifier circuit 84 adds relatively strong even harmonic content to the signal, thus producing an output signal this has an output spectrum 88 with good strong harmonic content across the band.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

The measurement system could be combined with either passive or active networks at the input and output of the DUT to control the impedance around the DUT or for waveform engineering.

The signal driving phase reference standard circuit need not be provided by the VNA, but a component of the resulting phase reference standard output signal should ideally be phase-locked with a component of the signal that is applied to the DUT and phase-locked to the VNA's LO signal that determines the frequency of measurement.

Components at high order harmonics may be produced by the phase reference standard, but may have such low (negligible) magnitude as to be of no consequence. In other cases, the magnitude may be sufficiently high to merit the provision of a filter circuit to filter out such high order components.

A multi-tone signal may be injected into the phase reference standard system, such that the input signal has multiple high frequencies at the input of the phase reference standard system. In such a variant, the amplifier circuit of the phase reference standard system receives a multi-tone signal having two or more different frequency components, each defining a different fundamental frequency, and outputs a multi-tone output signal comprising components at the different fundamental frequencies and a number of harmonics of the different fundamental frequencies. The number of harmonics used by the phase reference standard system is limited to the first ten harmonics at most for each different fundamental frequency. All harmonic components associated with a given fundamental frequency have a given (stable), and pre-characterised, phase relationship relative to the fundamental frequency component. The data concerning the phase relationship between the different harmonic components covers the phase relationships between the harmonic components associated with each of the different fundamental frequencies. The DUT may then be accurately characterised in conditions where a complicated multi-tone signal is applied to the DUT by reference to the phase reference standard generated from a multi-tone input signal.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A method of providing a pre-characterised high frequency signal, the method comprising the steps of:
   a) providing a non-linear circuit,
   b) feeding a first signal having a first, fundamental, frequency into the non-linear circuit,
   whereby the non-linear circuit generates an output signal comprising components at a plurality of harmonic frequencies, the components of the plurality of harmonic frequencies having stable phase relation relative to each other, and
   c) providing information concerning the phase relation of said plurality of harmonic frequency components,
   whereby the output signal is in the form of a pre-characterised high frequency multi-tone signal,
   wherein
   the non-linear circuit includes
   d) a first non-linear circuit portion which, if provided with the first signal as its input signal, would generate harmonic components such that the average magnitude of the odd harmonic components would be a first factor higher than the average magnitude of the even harmonic components, and
   e) a second non-linear circuit portion which, if provided with the first signal as its input signal, would generate harmonic components such that the average magnitude of the even harmonic components would be a second factor higher than the average magnitude of the odd harmonic components,
   and wherein
   the first and second non-linear circuit portions are arranged such that the output is a signal which which has odd and even signal components of a similar magnitude;
   whereby
   the pre-characterised high frequency signal can then he used, within a high-frequency measurement system for measuring the behavior of nonlinear high frequency devices, as a phase reference standard with which absolute phase and magnitude measurements can be obtained.

2. A method according to claim 1, wherein at least 90% of the power of the harmonic components of the pre-characterised high frequency signal generated by the non-linear circuit is carried by harmonic frequency components at the tenth or lower harmonic frequencies.

3. A method according to claim 1, wherein the output signal is fed to a vector network analyser and the first signal is generated by a signal generator of the vector network analyser.

4. A method according to claim 1, comprising a thermally controlled chamber for maintaining the non-linear circuit at a substantially constant and pre-set temperature.

5. A calibration verification method comprising the steps of testing the calibration of a measurement apparatus by means of using the measurement apparatus to measure at least one of (a) the absolute phase relation between different signal components and (b) time domain measurements of a signal component relative to a fixed time, wherein the signal component(s) so measured are provided by performing the method of claim 1.

6. A method of measuring the response of an electronic device to a high frequency input signal, the method comprising the steps of:

a) providing an electronic device having a first port and a second port, and applying a high frequency signal to the device, b) providing a measurement system including a measurement apparatus having a plurality of inputs for measuring high frequency signals from the first and second ports, c) measuring, at a plurality of different frequencies, and with the use of the plurality of inputs of the measurement apparatus, signals from the first and second ports of the device, and d) ascertaining at least one of (i) absolute phase information from the signals so measured and (ii) a time domain representation relating to the signals measured by performing the method of claim 1.

7. A method according to claim 6, wherein the high frequency signal applied to the device under test is phase-locked with the first signal supplied to the non-linear circuit.

8. A method according to claim 6, wherein the method is performed to measure the non-linear behaviour of the electronic device.

\* \* \* \* \*